(12) United States Patent
Xiao (10) Patent No.: US 10,747,985 B2
(45) Date of Patent: Aug. 18, 2020

(54) NANOSTRUCTURE PIXEL SENSOR AND METHOD

(71) Applicant: Bo Xiao, Virginia Beach, VA (US)

(72) Inventor: Bo Xiao, Virginia Beach, VA (US)

(*) Notice: Subject to any disclaimer, the term of this patent is extended or adjusted under 35 U.S.C. 154(b) by 123 days.

(21) Appl. No.: 16/152,767

(22) Filed: Oct. 5, 2018

(65) Prior Publication Data

US 2019/0108385 A1 Apr. 11, 2019

Related U.S. Application Data

(60) Provisional application No. 62/569,467, filed on Oct. 6, 2017.

(51) Int. Cl.
| | |
|---|---|
| H01L 27/146 | (2006.01) |
| G06K 9/00 | (2006.01) |
| G06K 9/38 | (2006.01) |
| G01N 21/55 | (2014.01) |
| H04N 5/225 | (2006.01) |
| G01N 21/59 | (2006.01) |
| G06T 7/73 | (2017.01) |
| G01N 21/552 | (2014.01) |

(52) U.S. Cl.
CPC ......... *G06K 9/00134* (2013.01); *G01N 21/55* (2013.01); *G01N 21/554* (2013.01); *G01N 21/59* (2013.01); *G06K 9/0014* (2013.01); *G06K 9/38* (2013.01); *G06T 7/73* (2017.01); *H01L 27/14601* (2013.01); *H04N 5/2256* (2013.01)

(58) Field of Classification Search
CPC .... G06K 9/00134; G06K 9/0014; G06K 9/38; H01L 27/14601; G01N 21/554; G01N 21/59; G01N 21/55; G06T 7/73; H04N 5/2256
See application file for complete search history.

(56) References Cited

U.S. PATENT DOCUMENTS

| | | | | |
|---|---|---|---|---|
| 10,281,626 B2 * | 5/2019 | Jiang | ............ | G02B 5/1842 |
| 2012/0162771 A1 * | 6/2012 | Walter | ............ | B42D 25/29 |
| | | | | 359/569 |
| 2012/0319395 A1 * | 12/2012 | Fuhse | ............ | B42D 25/425 |
| | | | | 283/67 |
| 2014/0140054 A1 * | 5/2014 | Hashimura | ....... | B01D 67/0065 |
| | | | | 362/231 |
| 2014/0166974 A1 * | 6/2014 | Yoo | ............ | H01L 33/08 |
| | | | | 257/13 |

(Continued)

FOREIGN PATENT DOCUMENTS

WO WO-2013039454 A1 * 3/2013 ............ B42D 25/305

*Primary Examiner* — Earl N Taylor
(74) *Attorney, Agent, or Firm* — Bo Xiao (57) ABSTRACT

The present invention provides a nanostructure pixel sensor and a method for use thereof. A nanostructure pixel sensor includes a plurality of nanostructure pixels comprising periodic nanostructures. Every nanostructure pixel is designed to achieve a specific optical response at a given wavelength illuminated by a light beam. A nanostructure pixel sensor generates a wavelength-dependent image pattern, which is sensitive to the surrounding environment. The sensor described in the present invention utilizes image patterns to detect analytes and/or determine amount of analytes on the sensor surface or in the vicinity of the sensor surface.

20 Claims, 8 Drawing Sheets

(56) References Cited

U.S. PATENT DOCUMENTS

| | | | |
|---|---|---|---|
| 2015/0042702 A1* | 2/2015 | Jiang | B42D 25/328 |
| | | | 345/694 |
| 2016/0146984 A1* | 5/2016 | Jiang | G03F 7/0002 |
| | | | 359/567 |
| 2017/0023711 A1* | 1/2017 | Jiang | G02B 5/1809 |
| 2019/0108385 A1* | 4/2019 | Xiao | G01N 21/554 |

* cited by examiner

NANOSTRUCTURE PIXEL SENSOR AND METHOD

CROSS-REFERENCE TO RELATED APPLICATIONS

This application claims priority to U.S. Provisional Patent Application Ser. No. 62/569,467 filed Oct. 6, 2017, the disclosure of which is incorporated herein by reference in its entirety.

TECHNICAL FIELD OF THE INVENTION

The field of the invention generally relates to a sensor and in particular, but not exclusively, to a nanostructure pixel sensor for use in detecting and quantifying biological, chemical, or biochemical analytes. The invention additionally relates to methods of using the sensor of the present invention.

BACKGROUND OF THE INVENTION

Description of Related Art

Nanostructures offer unconventional control of light to shape optical wavefronts. Light can generate collective oscillations of electrons as surface plasmon resonance (SPR) bound to a nanostructure metallic surface. Metallic nanostructures in a certain arrangement can induce a coherent response of SPRs creating localized electromagnetic fields with a specific distribution. These nanostructure arrangements enable the efficient electromagnetic coupling of propagating light with localized fields that are highly sensitive to the surrounding environment. The sensitive responses of surface plasmon resonances have been utilized to detect biological, chemical, and biochemical analytes and analyze the interaction of molecules in real time.

SPR detection typically employs a noble metal film and optical structures such as prism, gratings, or waveguides to achieve momentum matching between the incident light and plasmon resonances. The excitation of SPRs occurs when incident light impinges on the metal film at a given angle, which results in a reduced intensity of the reflected light. A slight perturbation on the metal film surface, e.g. refractive index or surface geometry may disturb the momentum matching and cause an intensity change of the reflected light, which leads to an angular shift of the resonance. Traditional SPR sensing techniques rely on the detection of these angle changes for biological or chemical analysis.

Light transmission through a subwavelength aperture or an array of such apertures, such as nanoholes and nano-slits has been extensively studied recently, and these studies have revealed several unique properties of the manipulation of interactions between light and nanostructures. An approach using nanohole array has been developed for chemical and biomolecule detection. The technique, based on the extraordinary optical transmission of the subwavelength nanohole array, has demonstrated its sensitivity to detect viruses and observe a single monolayer of antibodies. The extraordinary or enhanced optical responses are not a unique phenomenon in the perforated metals such as nanohole structures or nanostructures with apertures. Corrugated metal films or flat metal films with properly arranged nanostructures can excite plasmon resonances on the surfaces, which result in similar enhanced transmission effects and Fano resonances.

A general interpretation of the phenomenon is represented by the well-accepted Bloch-mode excitation of a surface electromagnetic wave in the dielectric and metal interface. In periodic nanostructures or nanostructures with certain symmetries, these excitations can meet the Bloch condition and constructively couple with each other that result in strong Fano resonances. Incident light interfering with the nanostructures gives rise to an asymmetric Fano resonance in the transmission spectrum. The wavelength shift of the resonance directly corresponds to the changes of the refractive index. This technique measures this change in the transmission spectra to detect specific analytes and/or determine the concentration of analytes surrounding the detection surface. The detection can be performed in zero order transmission under broadband white light illumination, which eliminates the requirement of the prism, laser source and rotation stage that are commonly used in the total internal reflection SPR method. However, SPR detection based on plasmonic nanostructures still relies on spectrometers to determine small spectral changes and most of them only operate in transmission mode.

Nanostructured plasmonic thin films can be used either in a transmission or reflection operation mode for SPR detection. In the reflective operation mode, nanostructured plasmonic thin films can be fabricated as a periodic nanostructure array. Only considering in one dimension along the periodic arrangement, the periodic nanostructure array can be treated as a diffraction grating, which satisfies the general grating equation: $m\lambda = p(\sin\theta_i + \sin\theta_r)$, where m is the diffraction order and a light beam with a wavelength of $\lambda$ is incident on a diffraction grating with a periodic spacing of p at an angle $\theta_i$ and diffracted at an angle $\theta_r$. Consider a plane wave incident from a small angle ($\sin\theta_i \approx 1$). When a constructive interference occurs at the surface normal ($\sin\theta_r = 0$), SPRs can be excited as $p \approx \lambda$. At such an angle, a nanostructured plasmonic thin film can yield an enhanced reflection. Since the incident angle is small, the diffraction from the plasmonic resonances is extremely surface sensitive. They are strong coherent plasmonic responses and resemble the asymmetric spectral feature of Fano resonances. Furthermore, there is a fundamental difference between the conventional non-plasmonic and plasmonic gratings that the plasmonic phenomenon occurs only for the TM (transverse magnetic) polarized light. The strength of the plasmonic enhancement for a given wavelength directly depends on the distance (period) between individual nanostructures in a periodic nanostructure array. Therefore, varying the period of a nanostructured plasmonic thin film can change its response to light with a certain wavelength. In general, the relationship of the period and wavelength can be expressed as $\lambda = n_{eff} p$, where p is the period or the distance between individual nanostructures in a periodic nanostructure array and $n_{eff}$ is effective refractive index. Factors such as surrounding medium, structure profile and fabrication accuracy affect the effective refractive index. For nanostructures covered with a plasmonic thin film and nanostructure size less than the wavelength, the effective refractive index can be treated as 1.

Current nanofabrication technology offers many methods to fabricate the plasmonic nanostructures. However, the nanofabrication for plasmonic nanostructures typically involves lift-off and dry etching which introduce sharp edges, corners, and rough surfaces. In these structures, propagating light and surface plasmons can be scattered to all directions that reduce their transmission and reflection efficiency. These losses can be minimized by shaping plasmonic structures with a smooth profile rather than an abrupt one. Plasmonic nanostructures with a smooth profile can achieve sharp Fano resonances and increase the sensing ability.

SUMMARY OF THE INVENTION

The disclosed invention provides a nanostructure pixel sensor and a method for detecting and quantifying chemical, biological or biochemical analytes. A nanostructure pixel sensor consists of a plurality of nanostructure pixels each comprising a periodic array of nanostructures. Optical responses of transmitted or reflected light affect the light intensity or brightness level of the nanostructure pixels, which depend on the periodic spacing or pitch of the nanostructures. The nanostructure pixels with different periodic arrays of nanostructures may be organized in a specific format. These organized pixels illuminated by light at a given wavelength have different levels of brightness that generate a wavelength-dependent image pattern. The brightness is sensitive to the surrounding environment. Altering the environment such as capturing an analyte on the nanostructure pixel sensor changes the brightness of the nanostructure pixels that results in a different image pattern. A presence and/or amount of an analyte is determined based on such a change of the image pattern. The nanostructure pixel sensor described in the present invention utilizes image patterns to detect analytes and/or determine the amount of an analyte on the sensor surface or in the vicinity of the sensor surface. The disclosed invention further provides a method to use the nanostructure pixel sensor.

DETAILED DESCRIPTION OF THE INVENTION

Figure 1:
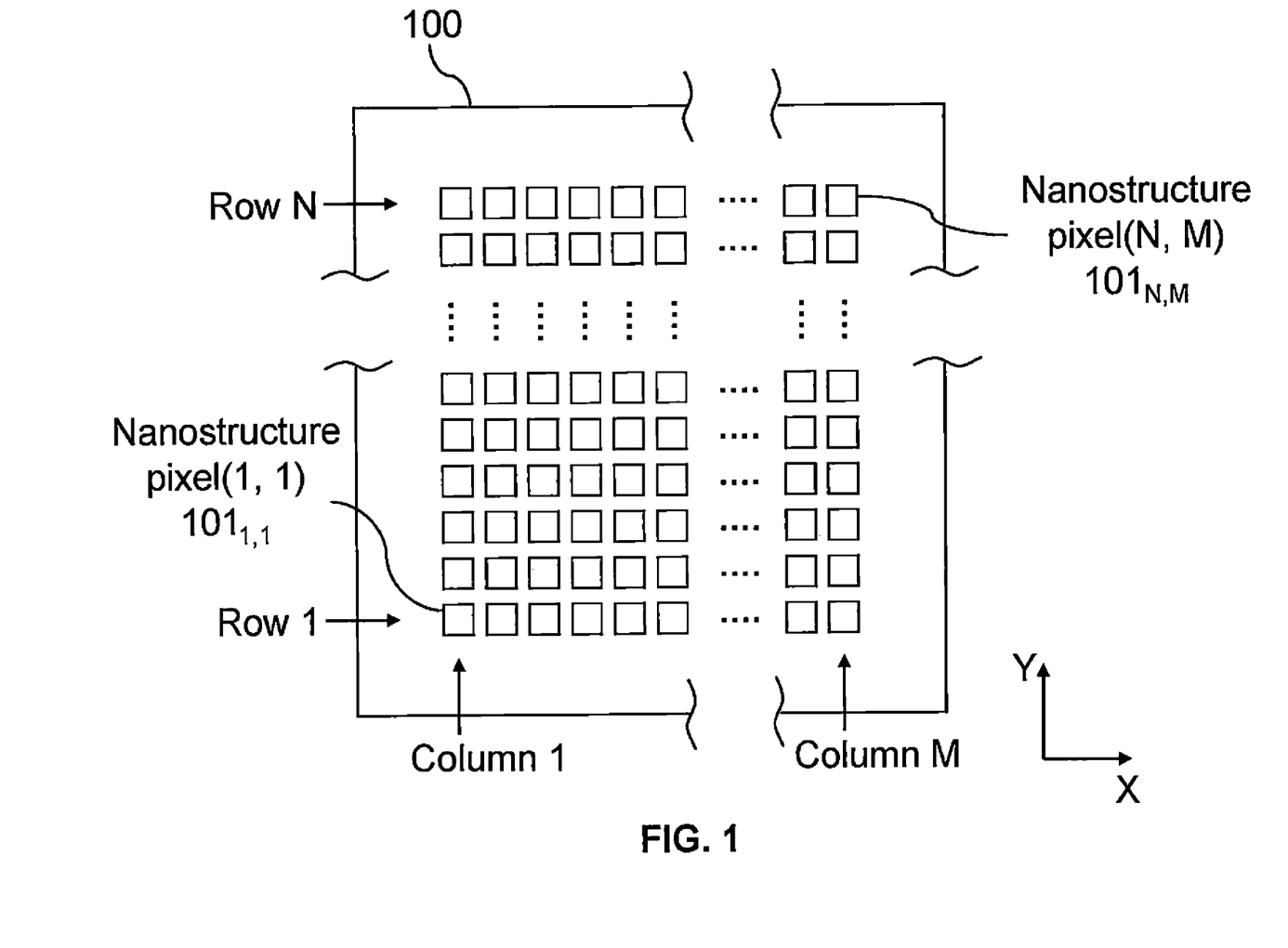
FIG. 1 presents a schematic diagram of an exemplary arrangement of nanostructure pixels on a nanostructure pixel sensor.

FIG. 1 is a schematic diagram of an exemplary arrangement of nanostructure pixels on a nanostructure pixel sensor 100. In one embodiment, the nanostructure pixel sensor 100 comprises a plurality of nanostructure pixels 101 and a substrate. The substrate that supports the nanostructure pixels can be a single substrate or a layer of materials. The nanostructure pixel 101 may be organized into rows and columns. A nanostructure pixel sensor 100 includes N rows and M columns of nanostructure pixels 101, $101_{n,m}$ is defined as a nanostructure pixel at the position of the nth row and mth column., where the indices of n and m increase along the direction of Y and X, respectively. The nanostructure pixels 101 are designed to response a given wavelength of light according to their positions. For example, the nanostructure pixel at the first row and column $101_{1,1}$ is designed to excite a strong plasmonic resonance at the wavelength of 400 nm and the pixel at the nth row and mth column $101_{n,m}$ is designed to excite a resonance at the wavelength of w determined in unit of nm by the formula: w=400+(n−1)M+m−1 with 1 nm interval of the wavelength. The nanostructure pixel sensor can obtain a strong plasmonic resonance when the sensor is illuminated by a light beam at a wavelength between 400 nm and 400+(N−1)M+M−1 nm, where N is the total number of the rows and M is the total number of the columns.

Figure 2:
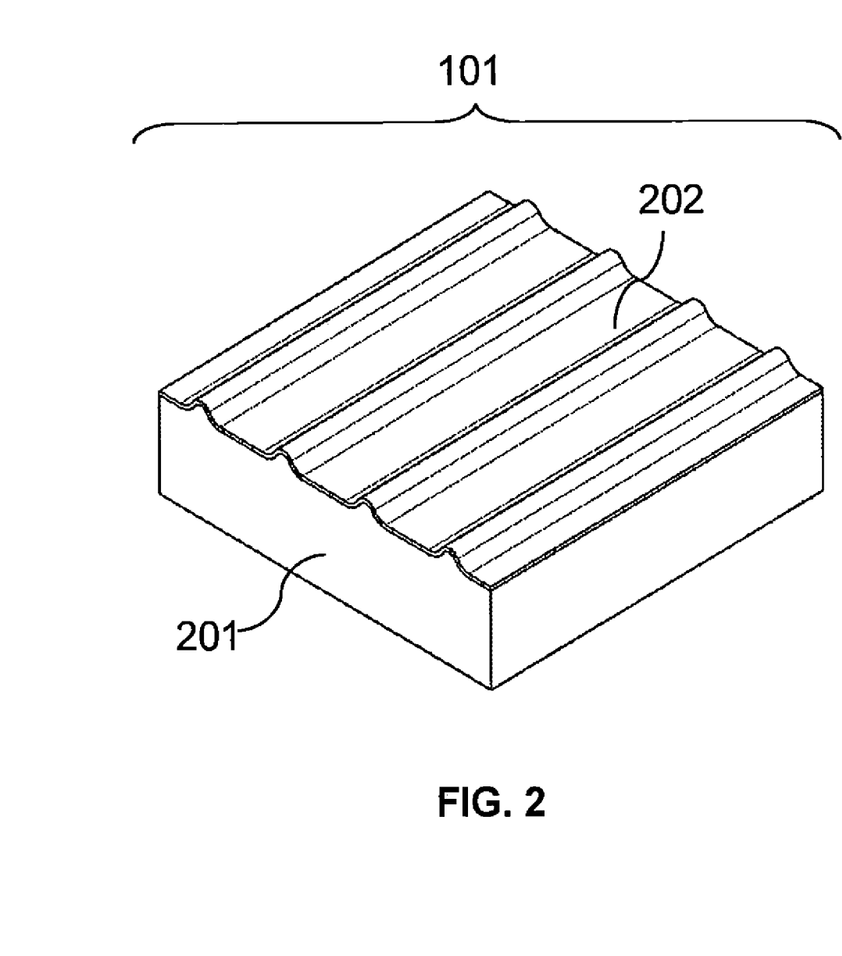
FIG. 2 illustrates a nanostructure pixel that may be used in the nanostructure pixel sensor of FIG. 1.
Figure 3:
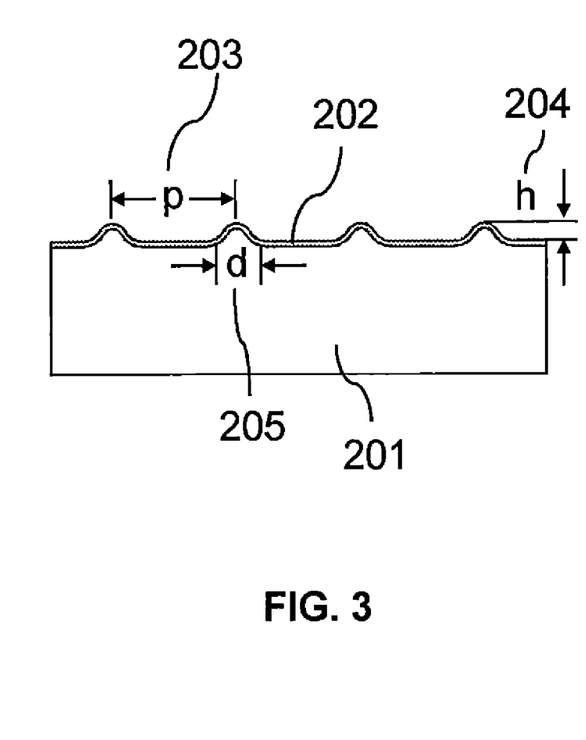
FIG. 3 presents a schematic cross-section view of a nanostructure pixel of FIG. 2.

In one embodiment, the nanostructure pixel 101 includes a periodic array of nanostructures 201 and a metallic thin film 202. The periodic array of nanostructures 201 form a grating structure, wherein every nanostructure is an elevation surface relief as illustrated in FIGS. 2 and 3. The periodic array of nanostructures 201 may be fabricated directly on a substrate or on one or more intermediate layers on a substrate. The materials used for the substrate and intermediate layers can be glass, silicon or polymers such as poly(methyl methacrylate) (PMMA), polycarbonate, polystyrene, or cyclic olefin copolymers. The metallic thin film 202 is deposited on the periodic array of nanostructures 201 by evaporation, sputtering, electroplating or any other appropriate method. The metallic thin film 202 may be composed of gold, silver, and so on that can excite surface plasmon resonances. Nanofabrication techniques generally involve lift-off and dry etching processes, which unavoidably introduce sharp edges, corners and rough surfaces that cause unwanted scattering losses and low plasmonic coupling efficiency. In order to increase the efficiency, the nanostructures in the periodic array 201 have rounded corners and edges as depicted schematically in FIG. 3. The smooth profile of the nanostructures can be obtained during or after the fabrication of the periodic array of nanostructures using a heating or wet etching process. The preferred thickness of the metallic thin film 202 is 10-60 nm. The preferred periodic spacing p 203 of the nanostructures is 400-1000 nm. The preferred height h 204 of the nanostructures is 20-300 nm. The preferred width d 205 of the nanostructures is less than 100 nm or less than 20% of the periodic spacing p 203. The periodicity and smooth profile of the periodic array allow the nanostructure pixels having closely matched wavevectors with the incident light to excite a coherent SPR that affects the brightness of the nanostructure pixel. Ideally, the maximum brightness of a nanostructure pixel illuminated by light with a wavelength λ can be achieved when p=λ, where p is the periodic spacing 203 and λ is the wavelength of light. Although the incident angle of light, observation angle, and fabrication errors may cause an offset of p and λ, the detection of the nanostructure pixel sensor mainly relies on a change of the image pattern which is a relative change and almost independent to the offset. Therefore, there is a simple strategy to design the nanostructure pixels. For example, a nanostructure pixel sensor can be designed to respond light with the wavelength from 400 to 899 nm by organizing nanostructure pixels in the format of 10 columns (M=10) and 50 rows (N=50)

where the periodic spacing p at the nth row and mth column is defined as p=399+10(n−1)+m, in unit of nm.

Figure 4:
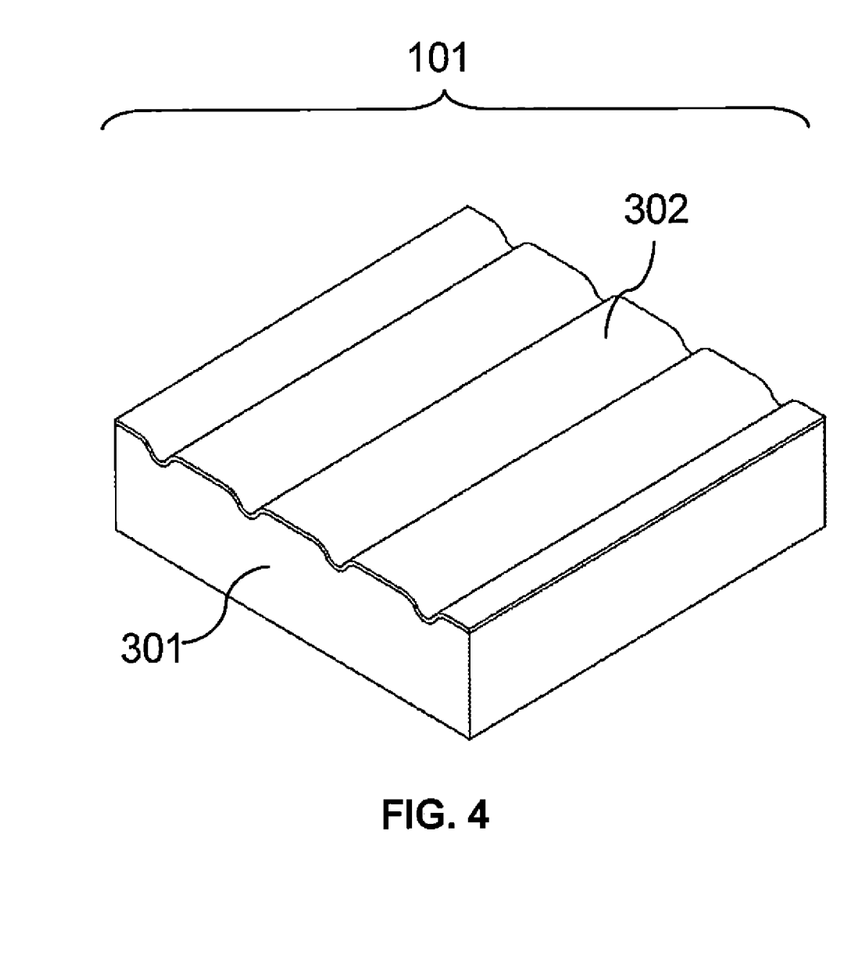
FIG. 4 illustrates an alternative nanostructure pixel that may be used in the nanostructure pixel sensor of FIG. 1.
Figure 5:
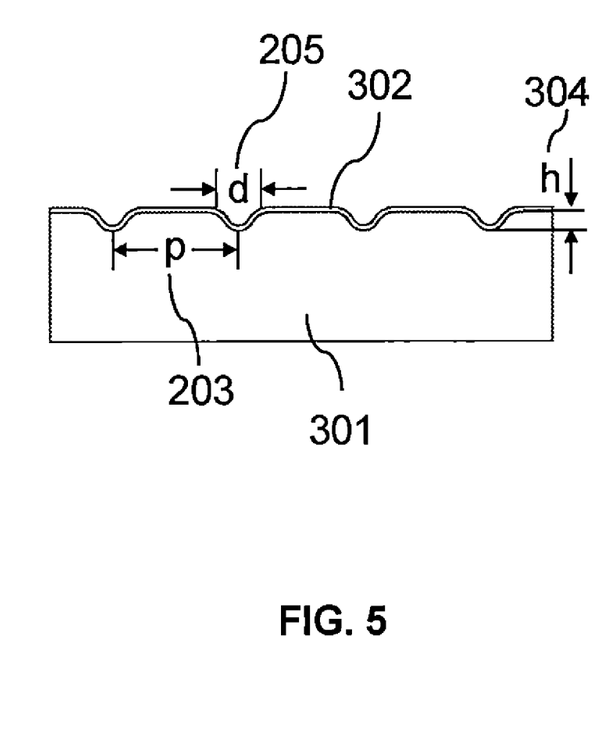
FIG. 5 presents a schematic cross-section view of a nanostructure pixel of FIG. 4.

In one embodiment, the nanostructure pixel 101 includes an alternative periodic array of nanostructures 301 and a metallic thin film 302, wherein the nanostructure is a depression surface relief as illustrated in FIGS. 4 and 5. These nanostructures may use the same or similar fabrication processes as the elevation surface relief of the nanostructure described above. The preferred depth 304 of the nanostructures is 20-300 nm and the preferred thickness of the metallic thin film 302 is 10-60 nm.

Figure 6:
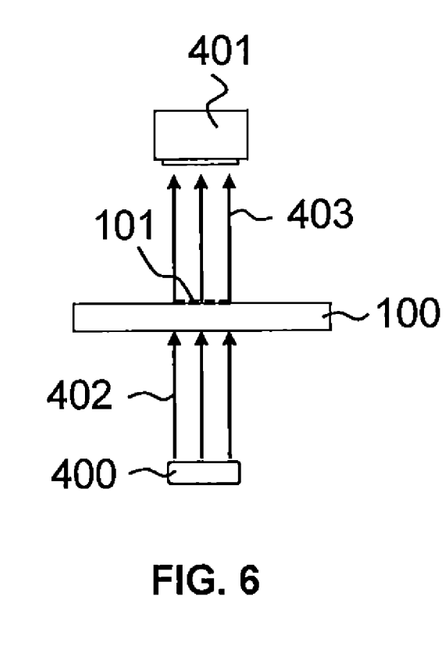
FIG. 6 illustrates a sensing method of using transmitted light for sensing.
Figure 7:
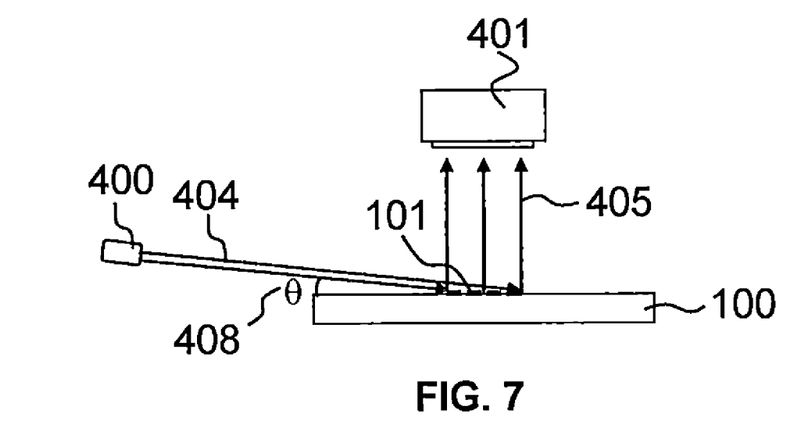
FIGS. 7 and 8 illustrate two alternative sensing methods of using various scattered light for sensing.
Figure 8:
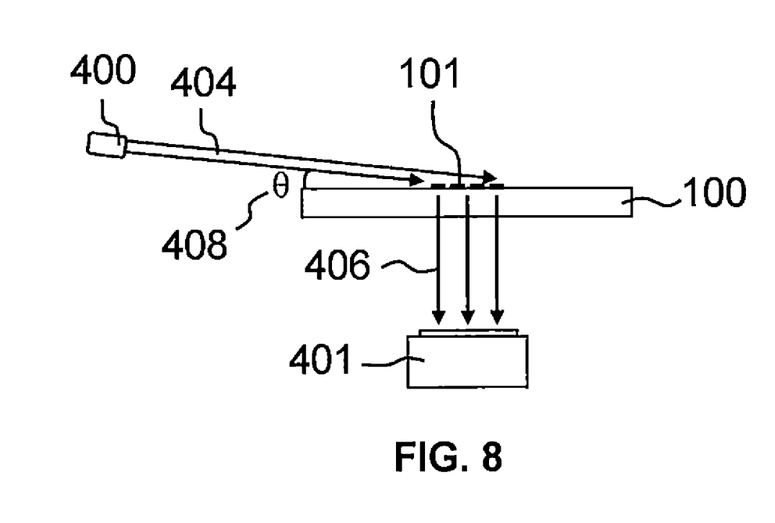

Analytes sought to be detected are brought in contact with or in the vicinity of the metallic thin film surface of the nanostructure pixels. These analytes change the local refractive index around the nanostructures, which affect the constructive or destructive interferences of the surface plasmon and evanescent electromagnetic waves. Therefore, the nanostructure pixels light up or dim when the analytes are altering the environment. The detection is based on a change or difference of the light before and after capturing an analyte on the nanostructure pixels. The light signals from the nanostructure pixels are collected by a camera when a light source operates in a transmission mode, a reflection mode or a combination of both. The incident and detected light can be set perpendicular or with a certain angle to the surface of the nanostructure pixel sensor. FIG. 6 schematically illustrates a sensing method using the present invention. A light source 400 generates polarized or non-polarized single wavelength or narrow-band wavelength light. If the light source 400 in FIG. 6 is polarized, the magnetic field vector of the light should be perpendicular to the grating vector. The incident light beam 402 illuminates the nanostructure pixels 101 from the backside of the present sensor 100. The transmitted light 403 is collected by a camera 401 to obtain an image of the nanostructure pixels 101. FIG. 7 illustrates an alternative sensing method, wherein the incident light beam 404 illuminates the nanostructure pixels 101 from one side of the present sensor 100 and scattered light 405 is collected by a camera 401 to obtain an image of the nanostructure pixels 101. FIG. 8 illustrates another alternative sensing method, wherein the incident light beam 404 illuminates the nanostructure pixels 101 and scattered and transmitted light 406 is collected by a camera 401 from the backside of the present sensor 100. The incident direction of the light beams 404 in FIGS. 7 and 8 is the same as the direction of the grating vectors of the periodic nanostructures. The preferred incident angle θ 408 of the light beam 404 is less than 10°.

Figure 9:
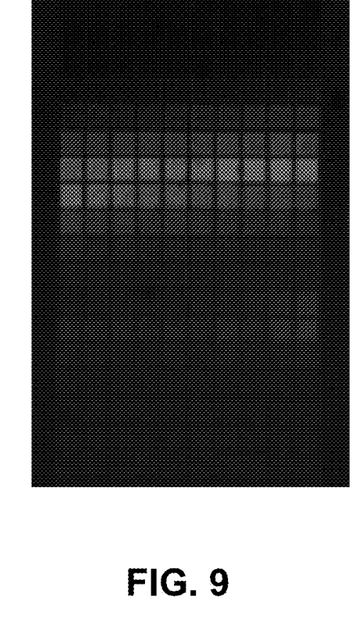
FIG. 9 presents a grayscale image showing nanostructure pixels on a nanostructure pixel sensor illuminated by a single wavelength light source.

The principle of sensing for using a nanostructure pixel sensor 100 is further explained referring to FIG. 9. FIG. 9 presents a grayscale image of multiple nanostructure pixels on a nanostructure pixel sensor, which is captured by a camera. The incident light with a fixed wavelength λ can be configured as FIG. 6, FIG. 7 or FIG. 8. The brightness of each nanostructure pixels is determined by the wavelength λ of the light source, the periodic spacing p and the surface environment of the nanostructure pixels. When the wavelength λ and the periodic spacing p of the nanostructure pixels are known, the image pattern formed by those pixels can determine a relative change of refractive index n of the surface environment in the sensor. The relationship can be simply expressed as np=λ. For example, if the wavelength of the light source is 780 nm, and the initial refractive index n equals to 1, the brightest nanostructure pixel is the one with the periodic spacing p of about 780 nm. Other nanostructure pixels may have much lower brightness or become totally dark as their periodic spacings are away from 780 nm. If the refractive index n of the surface environment changes from 1 to 1.005 when capturing an analyte, the brightest nanostructure pixels will be the ones whose periodic spacings are approximately 776 nm. Consequently, the brightest spots of the image move the positions from the 780 nm pixel to the 776 nm pixel.

Figure 10:
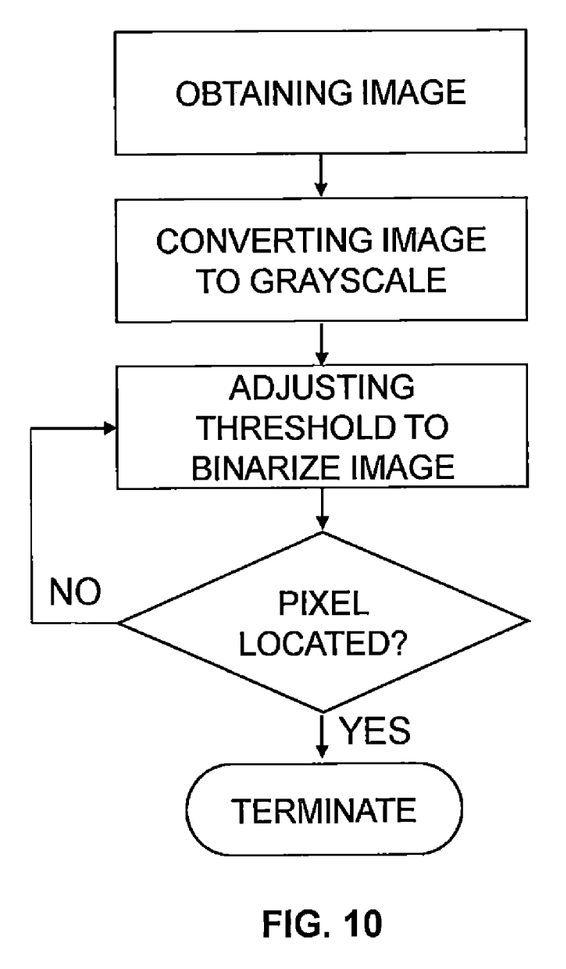
FIG. 10 presents a flowchart having exemplary operations for locating a brightest nanostructure pixel.

The image captured from a nanostructure pixel sensor can be processed to quantify the brightness for enhancing the detection accuracy. FIG. 10 presents a flowchart having exemplary operations for locating a nanostructure pixel having the largest value of the brightness. The operations include the steps: 1. obtaining an image of nanostructure pixels on a nanostructure pixel sensor; 2. converting the image to grayscale; 3. adjusting threshold to binarize the grayscale image; 4. locating the brightest pixel. At first, an image of a nanostructure pixel sensors is captured by a camera or an image sensor. Most cameras with color sensors encode color information in their output images. These images can be converted to grayscale ones. Brightness or luminous brightness is a measure of light intensity acquired by image sensors, which in general allows 256 different intensities to be recorded, starting from 0 to 255. Therefore, a threshold of the brightness can be set to binarize the grayscale image. The process alters the values of brightness in the grayscale image to either 0 or 255 in which the brightness values less than the threshold are set as 0 and the others as 1. After the binarizing process, one can more easily locate a peak or a brightest nanostructure pixel.

Figure 11:
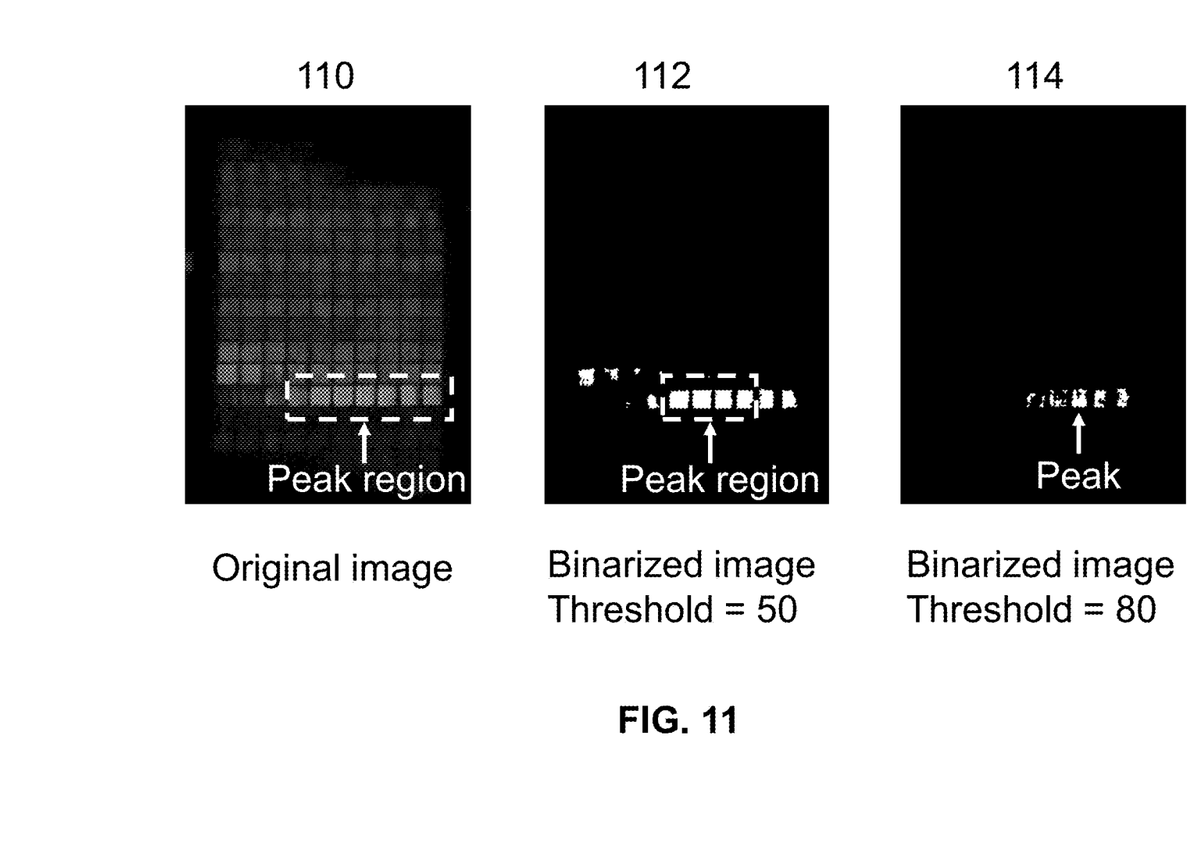
FIG. 11 presents exemplary images using the method of FIG. 10.

FIG. 11 presents exemplary images using the method of FIG. 10. The purpose of the process is to locate a nanostructure pixel which has the strongest response in the sensing process. Associated with the periodic spacing of the nanostructure pixel, the sensing is able to be quantified. The image 110 is an original black and white grayscale image whose grayscale values are between 0 and 255. The grayscale values represent the brightness where 0 means totally dark (black) and 255 totally bright (white) with intermediate values corresponding to intermediate brightness. If a threshold value is set as 50 to binarize the image, the original image can be converted to the image 112. The peak region is narrowed down to four nanostructure pixels. If the threshold value is adjusted to 80, one nanostructure pixel can be identified with the largest area of white spots as shown in the image 114. The method narrows down the peak position to a single pixel location.

Figure 12:
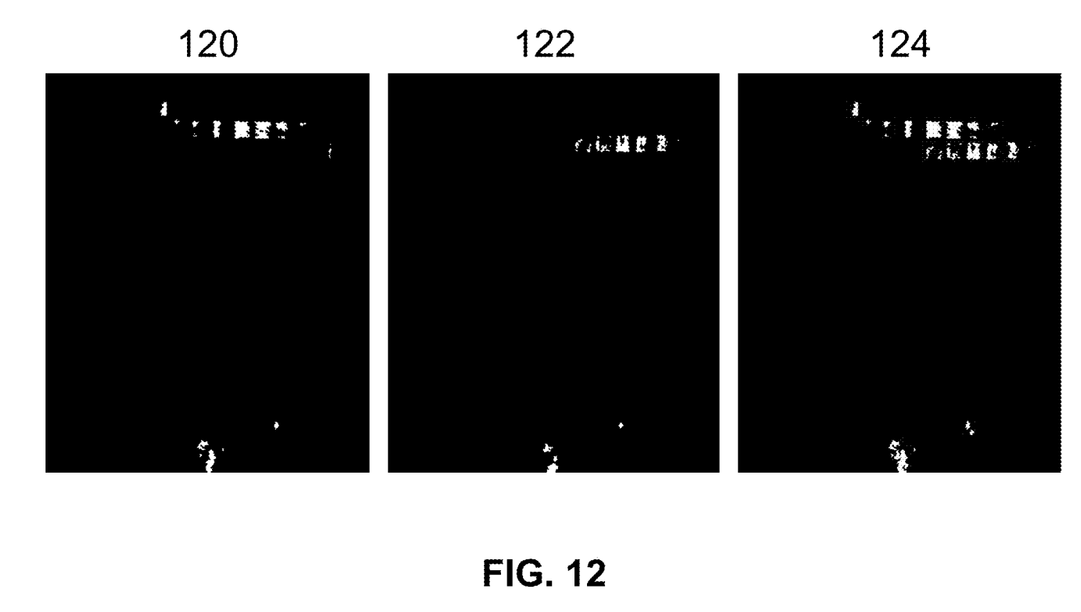
FIG. 12 presents an example of using a nanostructure pixel sensor for detecting biomolecules.

FIG. 12 shows a practical example of using a nanostructure pixel sensor for detecting biomolecules. Images in FIG. 12 were taken by a camera from a nanostructure pixel sensor coated with a gold thin film and then binarized. The surface of the sensor was functionalized through physisorption with protein A/G, which formed a self-assembled monolayer. The before image 120 taken before capturing protein IgG molecules shows the initial brightness of nanostructure pixels illuminated by a 650 nm laser as configured in FIG. 7. The after image 122 shows the nanostructure pixels after capturing a monolayer of IgG molecules under the same configuration. Captured IgG molecules on the surfaces of the nanostructure pixels changed the refractive index in the vicinity of the sensor surfaces that resulted in two different images. The comparison image 124 in FIG. 12 combined the before image 120 and after image 122 for comparison. The change of the image patterns gives an intuitive perception of the biomolecular interaction.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings, and the appended claims. In addition to variations and modifications in the component parts and/or arrangements, alternative uses will also be apparent to those skilled in the art.

What is claimed is:

1. A nanostructure pixel sensor, comprising:
a substrate and a plurality of nanostructure pixels, wherein
each of the nanostructure pixels includes periodic nanostructures and a metallic thin film, the periodic nanostructures have a smooth profile with rounded corners, the metallic thin film uniformly covers the periodic nanostructures, periodic spacings of the nanostructure pixels are different, and differences between adjacent values of the periodic spacings are equal.

2. The nanostructure pixel sensor of claim 1, wherein the periodic nanostructures in each of the nanostructure pixels form a grating structure.

3. The nanostructure pixel sensor of claim 1, wherein the nanostructure pixels are arranged in a matrix with N rows and M columns, a periodic spacing $P_{n,m}$ of the periodic nanostructures in the nanostructure pixel at an nth row and an mth column in the matrix with N rows and M columns is defined in unit of nm as $P_{n,m}=P_{1,1}+M(N-1)+M-1$, $P_{1,1}$ is the periodic spacing of the periodic nanostructures in the nanostructure pixel at a first row and a first column in the matrix with N rows and M columns.

4. The nanostructure pixel sensor of claim 1, wherein the periodic nanostructures are an elevation surface relief.

5. The nanostructure pixel sensor of claim 1, wherein the periodic nanostructures are a depression surface relief.

6. The nanostructure pixel sensor of claim 1, wherein the metallic thin film is a plasmonic thin film.

7. The nanostructure pixel sensor of claim 1, wherein the periodic spacings are in a range of 400 nm to 1000 nm.

8. The nanostructure pixel sensor of claim 1, wherein a width of each of the periodic nanostructures is less than 20% of a periodic spacing of the periodic nanostructures.

9. The nanostructure pixel sensor of claim 1, wherein a width of each of the periodic nanostructures is less than 100 nm.

10. The nanostructure pixel sensor of claim 1, wherein a thickness of the metallic thin film layer is in a range of 10 nm to 60 nm.

11. The nanostructure pixel sensor of claim 1, wherein the nanostructure pixels are arranged in a matrix with N rows and M columns, and the periodic spacings of the nanostructure pixels increase or decrease evenly along row or column.

12. A nanostructure pixel sensor, comprising:
a substrate and a plurality of nanostructure pixels, wherein
each of the nanostructure pixels includes periodic nanostructures and a metallic thin film, the periodic nanostructures have a smooth profile with rounded corners, the metallic thin film covers the periodic nanostructures, periodic spacings of the nanostructure pixels are different, and a width of each of the periodic nanostructures is less than 20% of a periodic spacing of the periodic nanostructures.

13. The nanostructure pixel sensor of claim 12, wherein the nanostructure pixels are arranged in a matrix, and differences between adjacent values of the periodic spacings are equal.

14. The nanostructure pixel sensor of claim 12, wherein the periodic nanostructures are an elevation surface relief.

15. The nanostructure pixel sensor of claim 12, wherein the periodic nanostructures are a depression surface relief.

16. The nanostructure pixel sensor of claim 12, wherein the metallic thin film is a plasmonic thin film.

17. The nanostructure pixel sensor of claim 12, wherein the periodic spacings are in a range of 400 nm to 1000 nm.

18. The nanostructure pixel sensor of claim 12, wherein the nanostructure pixels are arranged in a matrix with N rows and M columns, and the periodic spacings of the nanostructure pixels increase or decrease evenly along row or column.

19. The nanostructure pixel sensor of claim 12, wherein a width of each of the periodic nanostructures is less than 200 nm.

20. The nanostructure pixel sensor of claim 12, wherein a thickness of the metallic thin film layer is in a range of 10 nm to 60 nm.

* * * * *